(12) United States Patent
Moukara et al.

(10) Patent No.: US 7,354,683 B2
(45) Date of Patent: Apr. 8, 2008

(54) LITHOGRAPHY MASK FOR IMAGING OF CONVEX STRUCTURES

(75) Inventors: Molela Moukara, München (DE); Burkhard Ludwig, München (DE); Jörg Thiele, München (DE); Marco Ahrens, Hohenlinden (DE); Roderick Köhle, Ottobrunn (DE); Rainer Pforr, Dresden (DE); Nicolo Morgana, Dresden (DE)

(73) Assignee: Infineon Technologies AG, Munich (DE)

( * ) Notice: Subject to any disclaimer, the term of this patent is extended or adjusted under 35 U.S.C. 154(b) by 750 days.

(21) Appl. No.: 10/928,759

(22) Filed: Aug. 27, 2004

(65) Prior Publication Data
US 2005/0095512 A1    May 5, 2005

(30) Foreign Application Priority Data
Aug. 29, 2003    (DE) ................... 103 40 611

(51) Int. Cl.
*G03F 1/00*    (2006.01)
(52) U.S. Cl. ........................................... 430/5
(58) Field of Classification Search .................. 430/5, 430/394; 716/19–21
See application file for complete search history.

(56) References Cited

U.S. PATENT DOCUMENTS

| 6,238,824 | B1 | 5/2001 | Futrell et al. |
| 6,670,081 | B2* | 12/2003 | Laidig et al. ................... 430/5 |
| 6,680,151 | B2 | 1/2004 | Heissmeier et al. |
| 6,681,379 | B2* | 1/2004 | Pierrat et al. ................. 716/19 |
| 6,730,463 | B2 | 5/2004 | Heissmeier et al. |
| 2002/0129327 | A1 | 9/2002 | Pierrat et al. |

FOREIGN PATENT DOCUMENTS

DE    101 29 202 C1    9/2002
DE    101 19 145 C1    11/2002

* cited by examiner

*Primary Examiner*—S. Rosasco
(74) *Attorney, Agent, or Firm*—Slater & Matsil, L.L.P.

(57) ABSTRACT

A lithography mask has an angled structure element (O) formed by a first opaque segment (O1) and by a second opaque segment (O2). The structure element has at least one reflex angle ($\alpha$). The angled structure element (O) includes at least one convex section (A) facing the reflex angle ($\alpha$). At least one transparent structure (T) adjacent to the angled structure element (O) is provided at the convex section (A) of the angled structure element (O). The transparent structure (T) is formed in separated fashion at the convex section (A) of the angled structure element (O) and thus comprises two distinguishable transparent segments (T1, T2) formed at least in sections essentially axially symmetrically with respect to the angle bisector (WH) of the reflex angle.

30 Claims, 7 Drawing Sheets

LITHOGRAPHY MASK FOR IMAGING OF CONVEX STRUCTURES

This application claims priority to German Patent Application 103 40 611.5, which was filed Aug. 29, 2003, and is incorporated herein by reference.

TECHNICAL FIELD

The invention relates to a lithography mask for fabricating integrated semiconductor circuits such as VLSI and ULSI circuits by means of photolithography methods.

BACKGROUND

Particularly in the case of phase masks as lithography masks for circuits having a high integration density, the bend locations of convex structures have an unstable behavior with regard to a defocusing of the exposure system used. A convex structure is understood to be an angled structure element formed by a first and a second segment opaque to the exposure radiation where the structure element has a reflex angle. The region facing the reflex angle is referred to as convex section with the convex bend location, and the region facing away from the reflex angle is referred to as concave section of the angled structure element.

Figure 1A:
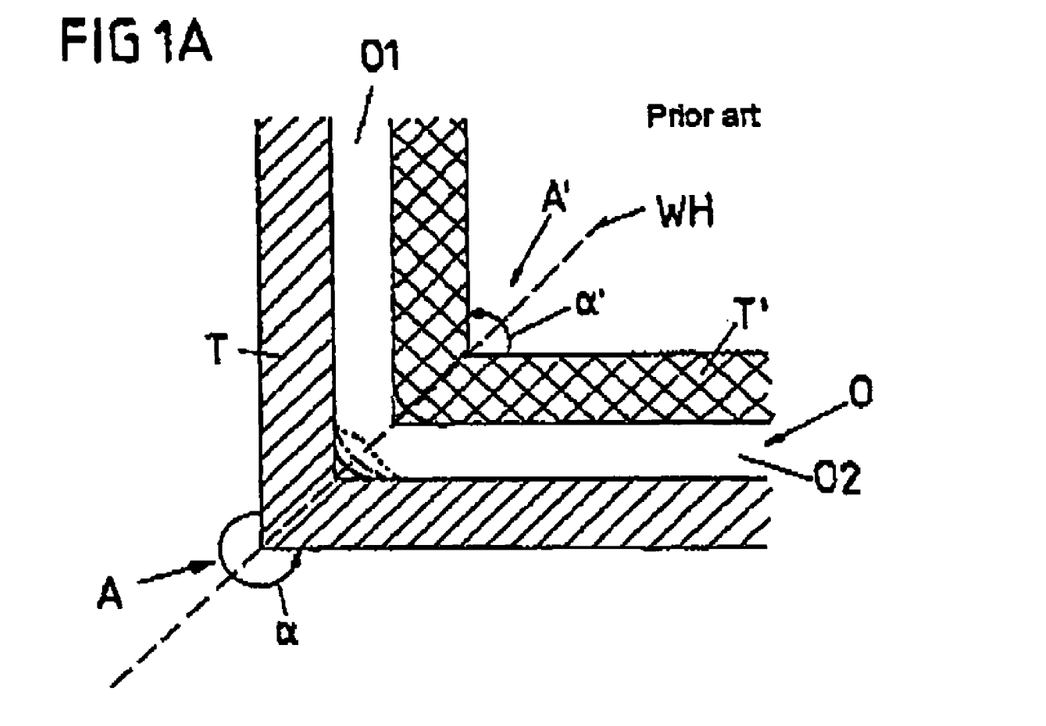
FIGS. 1a and 1b diagrammatically show convex structures of a bright-field phase mask according to the prior art.
Figure 1B:
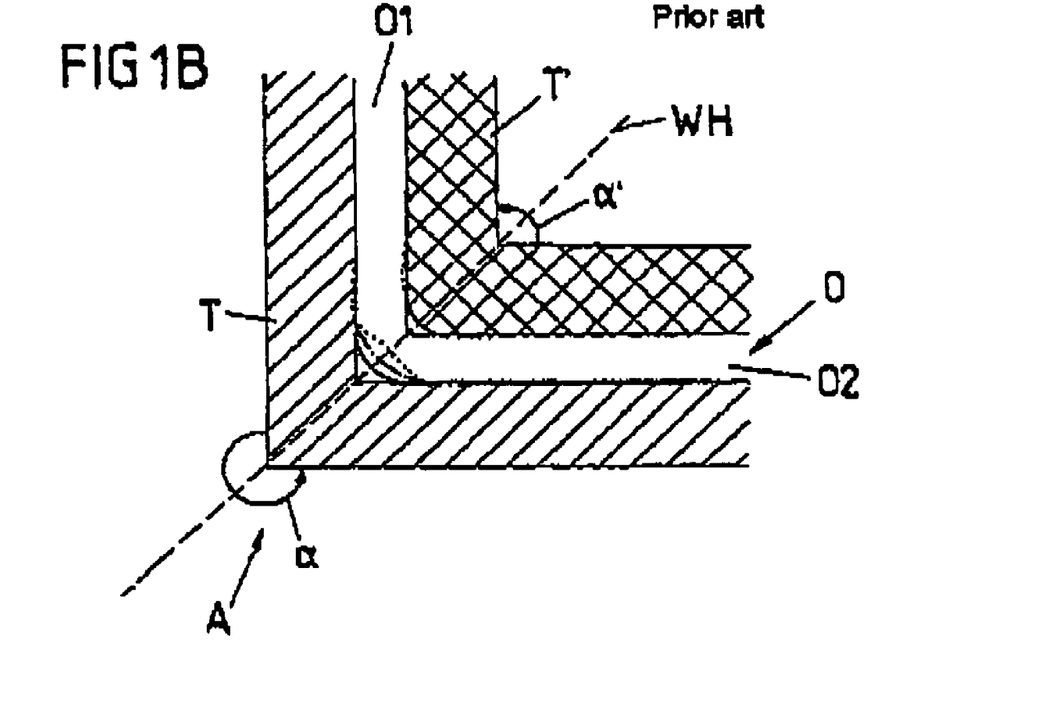

FIGS. 1a and 1b diagrammatically illustrate specifically an alternating bright-field phase mask as a lithography mask having in each case an angled structure element O of the type known from the prior art.

The two opaque segments O1 and O2 formed such that they are of the same size and rectangular, in each case form an angled structure element O with a reflex angle $\alpha=270°$ in the so-called convex section A of the angled structure element O. Located opposite the reflex angle $\alpha$ in each case is a right-angled counterpart angle $\alpha'=90°$ in the so-called concave section A' of the angled structure element O. On the part of the convex section A, a first segment T that is transparent with regard to the exposure radiation extends adjacent to the two opaque segments O1 and O2.

In this patent application, the feature adjacent is understood to be a direct adjoining of the adjacent regions without an interspace or intermediate section.

On the part of the concave region A', a second segment T' that is transparent with regard to the exposure radiation extends adjacent to the two opaque segments O1 and O2. Both transparent segments T and T' have an angled form corresponding to the angled structure element O.

On the side facing away from the angled structure element O, the transparent segments T and T' illustrated in FIGS. 1a and 1b are in each case surrounded by regions of the phase mask which are opaque to the exposure radiation. Like the opaque segments O1 and O2, these regions are usually formed as thin metal layers, for example made of chromium.

The second transparent segment T' is formed such that it is in antiphase with respect to the first transparent segment T. In antiphase is to be understood such that the exposure radiation of the phase mask has experienced a mutual phase shift of 180° after passing through the transparent segments T and T'. This in-antiphase formation of different transparent segments on a phase mask is also illustrated by the designation "alternating" phase mask.

However, the unstable behavior at convex structures occurs not only in the case of alternating phase masks but also in the case of conventional lithography masks without phase-shifting regions.

For graphic illustration, the transparent segments are depicted as either hatched or checked in all the figures, there being a phase difference of 180° in each case between the hatched and checked segments.

For reasons of better clarity of the graphic illustration, both the reflex angle $\alpha$ and the associated counterpart angle $\alpha'$ are in each case not depicted directly at the convex and concave bend location of the angled structure element O, but rather outside the hatched and checked regions, respectively.

The destructive interference effect between two closely adjacent and coherent light beams having phases shifted through 180° can be exploited in order to be able to expose structures that are narrower than the wavelength of the exposure radiation used. No photosensitive material is exposed in the region in which the light beams interact with one another. The simulation calculations for the exposure of convex structures explained below were carried out in FIGS. 1a and 1b for an exposure radiation having the wavelength $\lambda=193$ nm with a partial coherence factor for the phase mask of $\sigma=0.35$, the angled structure element O having a width of 150 nm in FIG. 1a and of 100 nm in FIG. 1b. The convex bend locations having the angle $\alpha=270°$ of the angled structure elements O are so small in relation to the wavelength of the exposure radiation that their images appear as rounded structures even with ideal focusing. This is illustrated in FIGS. 1a and 1b on the basis of the rounded solid lines in the bend regions of the angled structure elements.

In the concave bend region, the rounding is due to the fact that the intensity of the exposure radiation in this region, on account of the small dimensions of the bend region in comparison with the wavelength of the exposure radiation, does not suffice to ensure an exposure right into the rectangular concave corner region.

In the convex bend region, by contrast, constructive interferences of the in-phase exposure radiation from regions of the first transparent segment T that are adjacent to the two opaque segments O1 and O2 are the cause of the instances of rounding that occur.

The extent of rounding essentially depends on the focusing. With non-ideal focusing (the rounded solid line shows the result of a simulation calculation for the defocus value 0.0 μm), the rounding that occurs in the convex bend region, with increasing defocusing advances ever further in the direction of the concave bend region (dash-dotted line for defocus value 0.3 μm) and finally even changes the direction of curvature into the direction of the concave bend region (dotted line for the defocus value 0.4 μm).

This effect is referred to as unstable behavior of the convex structure with regard to the defocusing and is a consequence of severe constructive interferences. Comparison of FIGS. 1a (150 nm width of the opaque segments) and 1b (100 nm width of the opaque segments) reveals: the narrower the structure to be exposed or the higher the defocus value, the more serious are the undesirable degenerations of the convex bend regions.

By contrast, the degree of defocusing of the exposure radiation does not affect the position and formation of the rounding in the concave bend region. The solid, dash-dotted and dotted lines run essentially congruently here.

SUMMARY OF THE INVENTION

Consequently, the preferred embodiment of the present invention provides a lithography mask which, even when defocusing of the exposure radiation occurs, reduces constructive interferences in the convex bend region in such a way that the quality of the exposed convex structures, in particular the convex bend regions thereof, is improved.

In the case of the lithography mask according to the invention, the transparent structure adjacent to the angled structure element is formed in separated fashion at the convex section of the angled structure element and thus comprises two distinguishable transparent segments for reducing imaging errors of the exposed angled structure element at the convex section, the two transparent segments being formed at least in sections essentially axially symmetrically with respect to the angle bisector of the reflex angle;

and/or is formed such that it has, in the convex section of the angled structure element essentially along the angle bisector of the reflex angle, a width that is wider than a standard width used for the transparent segments of the lithography mask.

The two-part, distinguishable configuration of the transparent structure has the advantage that the constructive interferences at the exposed angled structure element are reduced by two transparent segments at the convex section. The distinguishability of the two transparent segments comprises either the fact that the transparent segments are spaced apart from one another, thereby reducing the radiating-in of light at the convex region, and thus the effect of the constructive interference of the exposed angled structure element, or that the two transparent segments have different properties in order that the distinguishability between them exists. In the case of phase masks as lithography mask, such a property of transparent segments is the phase assigned to the transparent segments. A differing phase of the transparent segments adjacent to the convex section of the opaque segment reduces a constructive interference during the exposure operation and thus improves the quality of the exposure. The two transparent segments may be both spaced apart and provided with a differing phase.

An enlarged width of the transparent segment at the convex section reduces light scattering of adjacent structures or structure boundaries in the convex section during exposure of the lithography mask.

The transparent structure of the lithography mask that is adjacent to the convex section may both be subdivided into distinguishable transparent segments and have an enlarged width, or have only one of the two features in order to achieve the object according to the invention.

An axially symmetrical formation of the two transparent segments "at least in sections" is to be understood to mean that, in the convex section of the angled structure element, either the first or the second transparent segment, in the event of a mirroring at the angle bisector, covers at least a partial region of its assigned transparent segment formed in antiphase. It is thus possible for one of the two transparent segments to have sections that have no axially symmetrical counterpart of the other transparent segment. In such a case, however, the area of the "smaller" transparent segment is completely mirrored into the area of the "larger" transparent segment.

The extent of the convex section that is crucial for the previous consideration comprises the surroundings of the convex bend region and ends at the latest before a renewed convex or concave bend region of one of the opaque segments.

In the exemplary embodiments, the lithography mask according to the invention is divided into three variants that are described. The first variant relates specifically to a phase mask, while the other two variants can be applied to any type of lithography mask.

The first variant of a phase mask as lithography mask has, according to the invention, at the convex section of the angled structure element, a first transparent segment adjacent to the first opaque segment and a segment that is in antiphase with respect to the first transparent segment and is adjacent to the second opaque segment, as partial segment, the first and second transparent segments being formed at least in sections essentially axially symmetrically with respect to the angle bisector of the reflex angle.

The in-antiphase formation of the transparent segments that are located opposite in the convex section essentially axially symmetrically with respect to the angle bisector of the reflex angle prevents a constructive interference of exposure radiation in the convex bend region. Accordingly, destructive interference of the exposure radiation occurs in the boundary region of the two transparent segments, so that, after the exposure with the phase mask according to the invention, the region of destructive interference remains unexposed.

As a preferred configuration of the phase mask, the first transparent segment is spaced apart from the second transparent segment by a separating section. This separating section is preferably formed in opaque fashion or provided with a so-called intermediate phase.

An opaque separating region shades a corresponding region during the exposure, which region thereby remains unexposed. This region therefore has to be postexposed by means of a second exposure operation using a correspondingly formed trimming mask. The formation of trimming masks required for this purpose is disclosed for example in DE 10129202 C1.

If the separating section is assigned an intermediate phase then a further exposure operation using a trimming mask is not necessary at this point. The intermediate phase lies between the two phases of the in-antiphase phase-shifting regions that are principally used on the phase mask. By means of the intermediate phase, the region lying between two in-antiphase transparent regions is exposed despite destructive interference of the two in-antiphase transparent regions. The constructive interference effect—leading to imaging errors—at the convex section of the opaque segment is greatly reduced, however, thereby reducing the imaging error.

It is advantageous to arrange the separating section essentially axially symmetrically with respect to the angle bisector of the reflex angle. In this case, the separating section forms a gap by which the two in-antiphase transparent segments are spaced apart essentially axially symmetrically with respect to the angle bisector.

The lithography mask according to the invention is suitable for exposure of a photosensitive material by means of electromagnetic radiation having a defined exposure wavelength. The separating section between the first and second transparent segments preferably has a width in the range of 0.5 to 1.0 times the exposure wavelength. In the case of lithography masks in which the transparent segments are not assigned a fixed phase, a width of the separating section in the region of half the wavelength is required in order to obtain a non-exposed region on the substrate to be exposed. In the case of alternating phase masks in which the transparent segments adjacent to the separating section are assigned a phase shifted through 180°, the separating section does not require a measurable width. In this case, the destructive interference effect by itself suffices to ensure a non-exposed region on the substrate even in the case of directly adjacent transparent segments having a differing phase (also called "chromiumless transition").

An advantageous embodiment is characterized in that the separating section between the first transparent segment and the second transparent segment has a width in the region of half the exposure wavelength.

In the case of the axially symmetrical embodiment of the opaque separating section, the width of the separating section corresponds in each case to the distance between the two transparent segments measured perpendicularly to the angle bisector.

The first opaque segment and the second opaque segment are preferably formed such that they are essentially rectangular. However, other geometrical forms are also conceivable, for example trapezoids, wedges, parallelograms or partly rounded structures; all that is essential in each case is that the first and second opaque segments are arranged relative to one another in such a way that a reflex angle with a convex bend region arises. In this case, the convex bend region may also have a rounded form given a corresponding formation of the opaque segments. The angle bisector of the reflex angle is then formed by the axis of symmetry of the convex section with the rounded convex bend region.

In a preferred embodiment of the phase mask, the reflex angle has a magnitude of 270°. The two opaque segments of the angled structure element are thus arranged perpendicular to one another at least in the convex section.

On account of the two-part formation of the transparent structure and the differing phase of the transparent segments forming the transparent structure, phase conflicts may occur. This means that the transparent segments assigned to an opaque structure were not assigned the required phase difference of 180° in order to image the opaque structure in a manner free of errors. Preferably, these phase conflicts are resolved by means of a two-part formation of transparent structures assigned to opaque structures adjacent to the transparent structure formed in two parts. The transparent segments that form the transparent structures formed in two parts are assigned phases such that a destructive interference effect is caused both at the transition regions of the two-part formation and at the adjacent opaque segments.

The two-part configuration of transparent structures and assignment of alternating phases is preferably applied to the adjoining transparent structures until all the phase conflicts have been resolved.

In a further embodiment, the angled structure element has a concave section that faces away from the reflex angle and has a counterpart angle opposite to the reflex angle. This embodiment is characterized in that, at the concave section of the angled structure element, a third transparent segment adjacent to the first opaque segment and a second transparent segment adjacent to the third opaque segment, the second transparent segment being in antiphase with respect to the third transparent segment, are arranged at least in sections essentially axially symmetrically with respect to the common angle bisector of the reflex angle and of the counterpart angle, the transparent segments located opposite at the opaque segments from the convex section to the concave section being formed such that they are in antiphase with respect to one another. In this way, the opaque segments between the convex section and the concave section are embedded by transparent segments formed such that they are in antiphase with respect to one another. For the reasons mentioned in the introduction, this enables the exposure of structures that are narrower than the wavelength of the exposure radiation.

The explanations made with regard to the convex section hold true with regard to the extent and the delimitations of the concave section.

Preferably, the third transparent segment is spaced apart from the fourth transparent segment in the concave section of the angled structure element by a second separating section.

In an advantageous manner, this second separating section is likewise either opaque or provided with an intermediate phase.

It is advantageous to arrange the second separating section in the concave section essentially axially symmetrically with respect to the angle bisector of the counterpart angle. The second separating section thus forms an axially symmetrical gap between the first and second transparent segments in the concave section of the angled structure element.

A further preferred embodiment of the first lithography mask variant is formed with two angled structure elements. This embodiment comprises a further angled structure element formed from a third opaque segment and a fourth opaque segment, the structure element having a further reflex angle and a further convex section facing the further reflex angle. The further angled structure element is arranged in such a way that the third transparent segment and the fourth transparent segment at the concave section of the angled structure element, in the convex section of the further angled structure element, act as a transparent segment adjacent to the third opaque segment of the further angled structure element and as a transparent segment adjacent to the fourth opaque segment of the further angled structure element.

In this way, the transparent segments arranged in the concave section of the first angled structure element simultaneously form the transparent segments arranged in the convex section of the second angled structure element. As a result, it is possible to minimize the distance between the two convex structures, which leads to an increase in the attained integration density of the propagating angled structure elements.

A further embodiment of the first phase mask variant is characterized in that a third opaque segment extends adjacent to the second transparent segment of the convex section of the angled structure element and intersects the angle bisector of the reflex angle, a section of the first transparent segment extending parallel to the angle bisector of the reflex angle as far as the third opaque segment and in the direction facing away from the angled structure element adjacent to the third opaque segment.

This embodiment makes it possible to realize a minimum distance between an elongated and an angled structure element. This likewise makes it possible to attain an increased integration density of the semiconductor structures to be fabricated.

In a preferred variant of the embodiment described above, a third separating section is arranged on that side of the third opaque segment which faces away from the angled structure element between a fifth transparent segment running adjacent to the third opaque segment and a sixth transparent segment running adjacent to the third opaque segment, the sixth transparent segment being in antiphase with respect to the fifth transparent segment.

The third separating section is preferably formed in opaque fashion or provided with an intermediate phase.

The third separating section is advantageously arranged axially symmetrically with respect to the angle bisector of the reflex angle. Moreover, the width of the third separating section corresponds to the width of the first separating section. By virtue of mutually corresponding widths of the separating sections arranged along the angle bisector of the reflex angle, the trimming mask required for the postexposure of opaque separating sections acquires a particular simple geometry.

In a further variant of the embodiment with a third opaque segment and a third separating section, the third separating section runs perpendicular to the direction of extent of the third opaque segment.

In this case, the third separating section is preferably arranged opposite the separating section of the convex section of the angled structure element.

In this exemplary embodiment, the width of the third separating section corresponds to the length of the boundary region between the separating section and the third opaque segment, and the edge regions of the third opaque separating section are in alignment with the ends of the boundary region between the separating section and the third opaque segment.

A further embodiment of the first phase mask variant is characterized in that a third opaque segment is arranged on that side of the angled structure element which faces away from the convex section of the angled structure element in such a way that a first partial angle is formed between the third opaque segment and the first opaque segment and a second partial angle is formed between the third opaque segment and the second opaque segment.

In this embodiment, preferably, a first angled transparent segment spanning the first partial angle is arranged adjacent to the first and third opaque segments and a second angled transparent segment spanning the second partial angle is arranged adjacent to the second and third opaque segments, the two angled transparent segments in each case being formed in antiphase with respect to the transparent segments located opposite them in the convex section of the angled structure element. This alternating formation of the phase angle of the transparent segments makes it possible to minimize the distance between the opaque segments and thus to increase the integration density. The in-antiphase formation of the two angled transparent segments prevents phase conflicts caused by constructive interferences in the region of the third opaque segment.

A further preferred configuration of the embodiment described above is characterized in that the third opaque segment extends along the angle bisector of the reflex angle lengthened in the direction of the third opaque element and the first partial angle has the same angle magnitude as the second partial angle. An arrow-shaped angled structure element can thus be produced by means of the three opaque segments.

The second variant of a lithography mask according to the invention achieves the object on which the invention is based by virtue of the fact that, at the convex section of the angled structure element, a first transparent segment adjacent to the first opaque segment as a partial segment and a second transparent segment adjacent to the second opaque segment as a partial segment are arranged at least in sections essentially axially symmetrically with respect to the angle bisector of the reflex angle, the first transparent segment and the second transparent segment being spaced apart from one another by a separating section.

The separating section spaces apart the two in-phase transparent segments at the convex section of the angled structure element in such a way as to reduce the constructive interferences in the region of the convex bend region. The requisite width of the separating section is approximately equal to 0.5 times the exposure wavelength. This even reduces the negative effect of increasing defocusing of the exposure radiation on the formation of the convex bend region.

This second variant of a lithography mask according to the invention also requires a postexposure of the region shaded by the separating region during the exposure using the phase mask by means of a trimming mask if the separating region is formed in opaque fashion.

The second variant of the lithography mask described above is suitable for exposure of a photosensitive material by means of electromagnetic radiation having a defined exposure wavelength. The separating section preferably extends between the first transparent segment and the second transparent segment over a region whose extent corresponds to 0.5 times to twice the exposure wavelength of the lithography mask.

A further embodiment of this second variant of the lithography mask preferably has a separating section which extends between the first transparent segment and the second transparent segment over a region corresponding to 0.75 to 1.5 times the exposure wavelength of the lithography mask.

For all of the above-mentioned embodiments of the second lithography masks, the separating region is preferably arranged essentially axially symmetrically with respect to the angle bisector of the reflex angle. If the boundary lines between the separating region and the adjacent two transparent segments are in this case arranged parallel to the angle bisector, then the distance between the two transparent segments that is defined by the separating region corresponds to a fixed value. By contrast, if the boundary lines are arranged at an angle in relation to the angle bisector, then the distance between the transparent segments varies in the value intervals mentioned.

A preferred embodiment has boundary lines that are in each case arranged perpendicularly on the adjacent opaque segments. As a result, the separating region acquires an essentially wedge-shaped geometry. The distance between the transparent segments therefore increases with increasing distance from the opaque segments.

The lithography mask is preferably an alternating phase mask in which the first and second transparent segments are formed such that they are in phase.

For all of the above-mentioned embodiments of the second lithography mask variant, the angled structure element, on its side facing away from the reflex angle has a transparent segment adjacent to it, the transparent segment being formed such that it is in antiphase with respect to the in-phase transparent segments arranged in the convex section of the angled structure element. By virtue of the in-antiphase transparent segments that are adjacent on both sides with respect to the direction of extent of the opaque segments, it is possible to reduce the width of the opaque segments transversely with respect to the direction of extent below the dimensions of the wavelength of the exposure radiation.

The third variant of a lithography mask for exposure of a photosensitive material by means of electromagnetic radiation having an exposure wavelength has a concave section facing away from the reflex angle, in which case, adjacent to the angled structure element, a first transparent segment is arranged in the convex section and a second transparent segment is arranged in the concave section.

Aspects of the invention provide for the first transparent segment, in the convex section essentially along the angle bisector of the reflex angle, to have an extent of at least 1.5 times the exposure wavelength. The width of the first transparent segment is greater than a standard width of the transparent segment that is generally used for the lithography mask.

The fact that the transparent segment is formed in widened or enlarged fashion in the convex bend region in the direction of the angle bisector of the reflex angle results in a reduction of so-called proximity effects that lead to constructive interferences in the convex section. This is due to the enlargement of the distance between the boundary region between the transparent segment and the convex bend region of the opaque angled structure element and the boundary region between the transparent segment and the surrounding opaque sections of the phase mask along the angle bisector of the reflex angle.

The enlargement or widening of the transparent segment is preferably formed essentially axially symmetrically with respect to the angle bisector of the reflex angle.

In a preferred embodiment of the third phase mask variant, the second transparent segment, in the concave section essentially along the angle bisector of the reflex angle lengthened into the concave section has an extent of at least 1.5 times the exposure wavelength. In this case, it is advantageous for reasons of symmetrical construction of the lithography mask that the extent of the first transparent segment along the angle bisector of the reflex angle essentially corresponds to the extent of the second transparent segment along the angle bisector.

Further advantages and features of the lithography mask are subdivided into three variants and explained on the basis of the following description of a few preferred embodiments.

BRIEF DESCRIPTION OF THE DRAWINGS

For a more complete understanding of the present invention, and the advantages thereof, reference is now made to the following descriptions taken in conjunction with the accompanying drawing, in which:

FIG. 2b diagrammatically shows an impaired embodiment of the phase mask structure shown in FIG. 2a;

FIG. 4b diagrammatically shows a further embodiment of the phase mask illustrated in FIG. 4a;

DETAILED DESCRIPTION OF ILLUSTRATIVE EMBODIMENTS

The figures uniformly show alternating bright-field phase masks as lithography masks. However, the second and third variants according to the invention can generally be applied to lithography masks while the first variant can generally be applied to alternating phase masks.

Figure 2A:
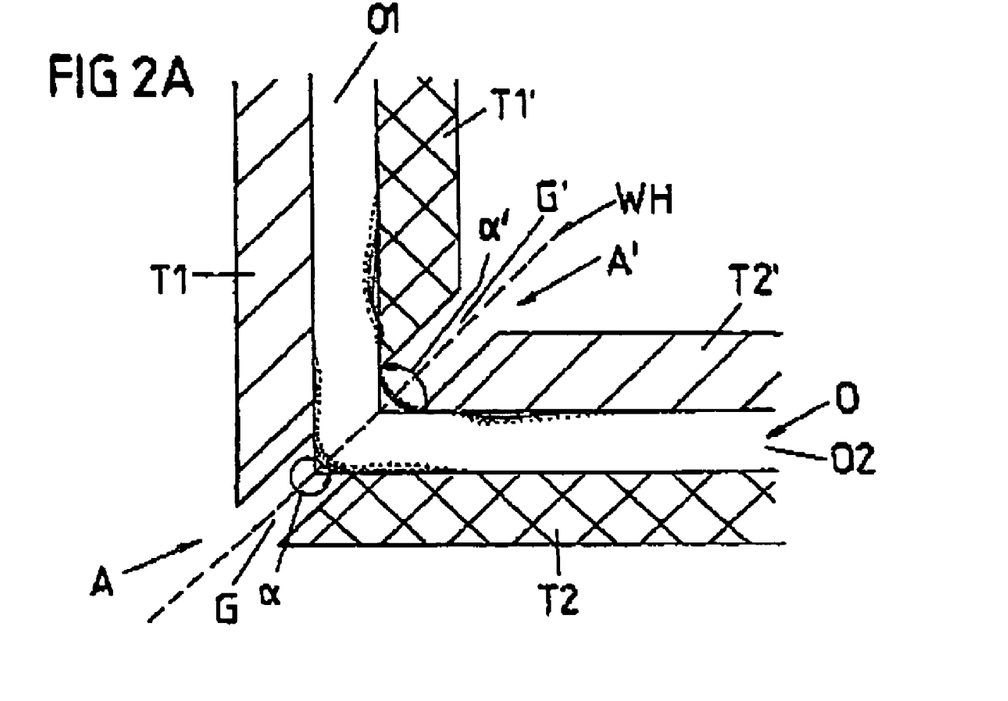
FIG. 2a diagrammatically shows a preferred embodiment of the first variant of the phase mask according to the invention.

The angled structure element O of the embodiment of the first phase mask variant according to the invention as illustrated in FIG. 2a corresponds in terms of its construction and its dimensions to the angled structure element O from FIG. 1a. Therefore, reference is made to the explanations already made with regard to the prior art.

In contrast to the phase mask structures that are known from the prior art and illustrated in FIGS. 1a and 1b, the angled structure element in FIG. 2a does not have in its convex section A facing the reflex angle α, a continuous transparent segment having the angled construction of the structure element O. A first transparent segment T1 extends along the edge of the first opaque segment O1 that is directed toward the convex section A, and a second transparent segment T2 extends along the edge of the second opaque section O2 that is directed toward the convex section A, the second transparent segment being formed such that it is in antiphase with respect to the first transparent segment.

These two transparent segments T1 and T2 are spaced apart from one another by an opaque separating section G arranged axially symmetrically with respect to the angle bisector WH of the reflex angle α.

The region of the concave section A' of the angled structure element O has a corresponding construction. The opaque segments O1 and O2 in each case have transparent segments T1' and T2' respectively adjacent to them, these two transparent segments in turn being formed such that they are in antiphase with respect to one another and being spaced apart from one another by means of an opaque separating section G' arranged axially symmetrically with respect to the angle bisector WH. In this case, the transparent segments T1, T1' and T2, T2' arranged at identical opaque segments O1, O2 respectively, in the convex and concave sections A, A' are in each case formed such that they are in antiphase with respect to one another. Furthermore, the width of the opaque separating sections G, G' between the in-antiphase transparent segments T1, T2 in the convex section A and the in-antiphase transparent segments T1', T2' in the concave section A' is made to be identical for reasons of symmetry in the entire structure.

The exposure of a photosensitive material using this structure requires a postexposure in the region of the two opaque separating sections G, G'. This is done using a trimming mask having transparent regions at the positions of the opaque separating sections G, G'. The exposure of the trimming mask, in contrast to the exposure of the phase mask, is effected with a lower coherence or a large partial coherence factor σ, which is why the convex locations can be imaged better during the trimming exposure than during the exposure of the phase mask.

Simulation calculations were carried out with regard to the influence of the degree of focusing on the geometrical features of the convex structure to be imaged. With regard to their parameters, the simulation calculations correspond to the explanations already made in connection with FIGS. 1a and 1b. An additional factor was the above-mentioned postexposure using a trimming mask, the trimming mask having been taken into account with a partial coherence factor of σ=0.85 in the simulation.

It can be seen that the convex bend location advances ever further inward in the direction of the concave region as the defocus value of the exposure radiation increases (solid curved line: defocus value 0.0 μm, dash-dotted curved line: defocus value 0.3 μm and dotted line: defocus value=0.4

μm). Moreover, slight indentations occur at the limbs of the opaque segments in the concave section A'.

Figure 2B:
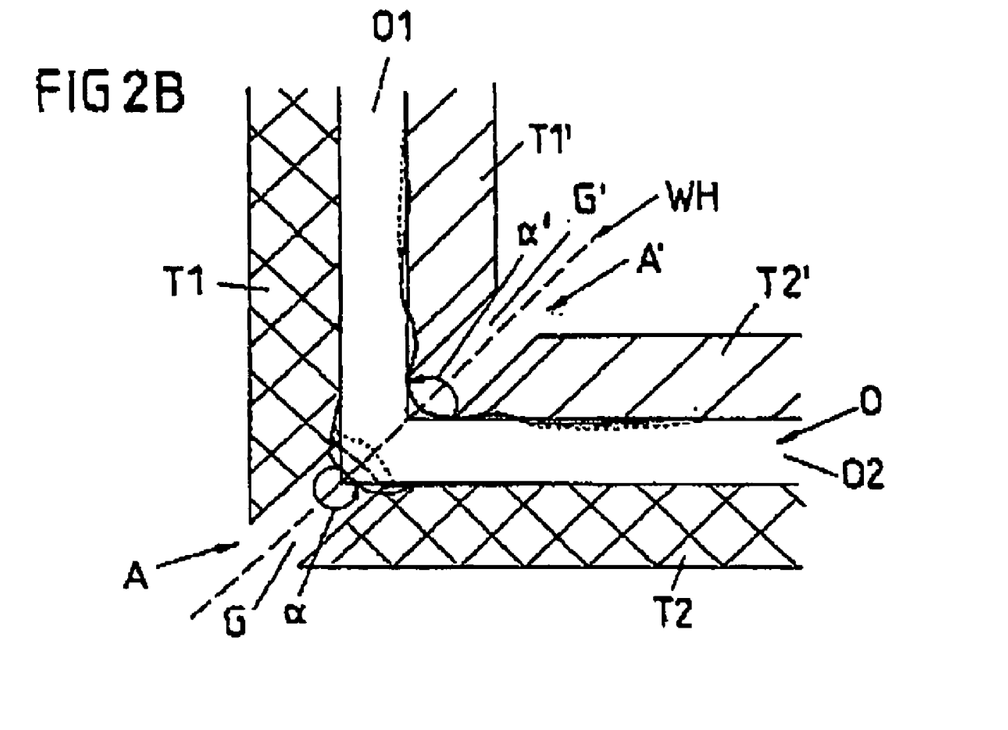

The mode of operation of the first phase mask variant according to the invention becomes particularly clear in a comparison with the structure shown in FIG. 2b.

Instead of forming the separating region G in opaque fashion, the separating region may also equally well be assigned an intermediate phase, for example the phase lying precisely between the two in-antiphase phases used for the transparent segments T1 and T2. The separating section G' may also be assigned an intermediate phase lying between the phases of the transparent segments T1' and T2'. In addition, the two intermediate phases of the separating sections G and G' should then also have a phase difference of 180° in order that the opaque structure located in between is imaged without constructive interferences. By way of example, the segments T2 and T1' may be assigned the phase 0°, the segments T1 and T2' may be assigned the phase 180°, the separating section G may be assigned the phase 90°, and the separating section G' may be assigned the phase 270°.

For the sake of simplicity however, the separating regions have been illustrated as opaque in FIG. 2a and in the following figures.

The convex structure shown in FIG. 2b differs in comparison with the structure shown in FIG. 2a exclusively in the phase angle of the transparent segments. The dimensions and the arrangement of the individual segments are thus identical between the structures in FIGS. 2a and 2b.

In FIG. 2b, the two transparent segments T1, T2 and T1' and T2' that are spaced apart in the convex and concave sections A and A', respectively, have the same optical phase.

The constructive interferences of the exposure radiation that are thereby made possible in the convex bend region lead, as the defocus of the exposure radiation increases, to a significantly more pronounced advancing of the convex bend region in the direction of the concave section A in comparison with the structure illustrated in FIG. 2a. The influence on the course of the exposed structure in the concave section A' is minor, by contrast.

Comparison of these two embodiments makes it clear that convex bend regions are generally to be treated using resolution enhancement techniques. In particular, convex bend regions characterize traditional phase conflicts in alternating phase mask technology. The phase jumps required for resolving these phase conflicts are equivalent to phase jumps whose use at concave bend regions is already known from the prior art.

Figure 3:
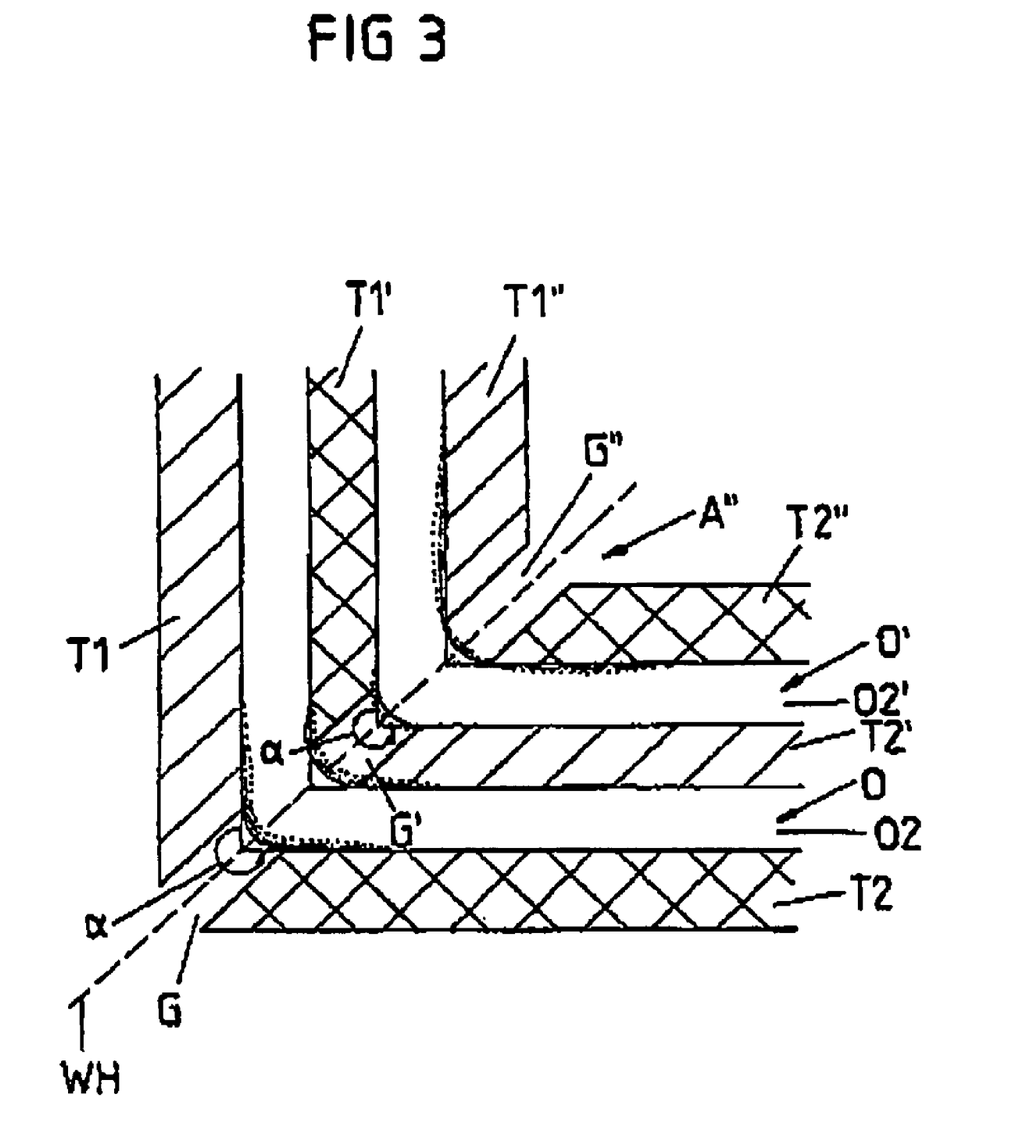
FIG. 3 diagrammatically shows a further embodiment of the first phase mask variant from FIG. 2a with a plurality of convex structures.

FIG. 3 shows a combined structure of two propagating convex structure elements O, O'.

The angled structure element O corresponds in terms of its construction and the arrangement of its elements to the structure described in FIG. 2a. Therefore, identical reference symbols are used for identical features and reference is made to the description thereof.

In contrast to the structure shown in FIG. 2a, a further angled structure element O' is arranged adjacent to the two transparent segments T1' and T2' arranged in the concave section A' on those sides of the segments which face away from the angled structure element O. This further convex structure element O' has the same dimensions as the first convex structure element O and is therefore constructed from two opaque segments O1' and O2' in a manner corresponding thereto.

Two transparent segments T1" and T2" are likewise arranged in the concave section A" of the further convex structure element O'. The further convex structure element O' has a first transparent segment T1" adjacent to the first opaque segment O1' and a second transparent segment T2" adjacent to the second opaque segment O2'. These two transparent segments T1" and T2" are spaced apart from one another by an opaque third separating section G" arranged axially symmetrically with respect to the lengthened angle bisector WH. For reasons of symmetry, the distances defined by the three opaque separating sections G, G' and G" are chosen to be of the same magnitude.

The simulation calculations show that this propagating arrangement of convex structures yields acceptable results with regard to the geometry of the exposed structures even in the case of the defocus values of the exposure radiation taken into consideration. A major advantage of the first phase mask variant according to the invention is that the convex structures can propagate along the angle bisector WH with a minimum distance as shown in FIG. 3 (here a distance of 150 nm between the two convex structures).

Figure 4A:
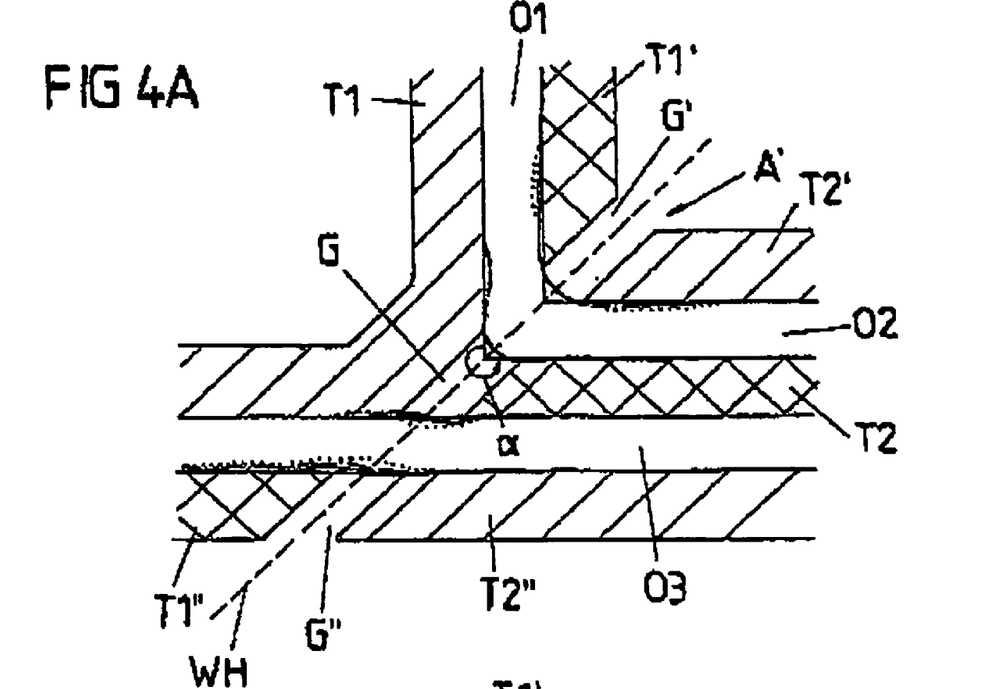
FIG. 4a diagrammatically shows a further embodiment of the first phase mask variant from FIG. 2a with an additional rectilinear structure element.
Figure 4B:
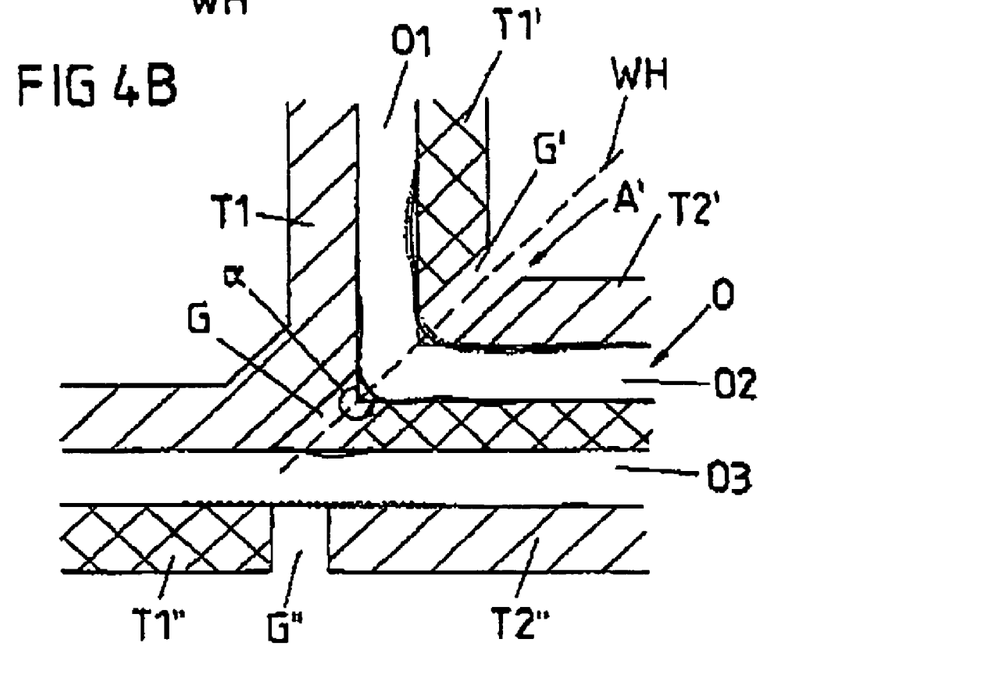

FIGS. 4a and 4b illustrate two further preferred exemplary embodiments of the first phase mask variant according to the invention as illustrated in FIG. 2a.

In this case, a further, third opaque segment O3 is arranged adjacent to a convex structure that corresponds to FIG. 2a with regard to its construction. This third opaque segment O3 is formed in rectilinear fashion and is adjacent to the transparent segment T2 on the side facing away from the angled structure element O. The third opaque segment O3 runs parallel to the second opaque segment and extends beyond the angle bisector WH.

In contrast to the phase mask structure illustrated in FIG. 2a, the transparent segment T1, in the boundary region with respect to the opaque separating section G, bends away in the direction of the third opaque segment O3, runs as far as the latter and along the latter away from the angled structure element O.

Consequently, the second transparent segment T2 and the above-described additional section of the first transparent segment T1 additionally function as transparent segments of the third opaque segment O3 on that side of the latter which faces the angled structure element O.

Two further transparent segments T1" and T2" that are formed such that they are in antiphase with respect to one another are arranged adjacent to that side of the third opaque segment O3 which faces away from the angled structure element O. The transparent segments are spaced apart from one another by a third opaque separating region G".

In the case of the embodiment illustrated in FIG. 4a, the third opaque separating region G", for reasons of symmetry, is arranged axially symmetrically with respect to the angle bisector WH of the reflex angle α and has the same width as the other two opaque separating regions G, G' in the convex and concave sections A, A', respectively, of the angled structure element O.

In the case of the embodiment shown in FIG. 4b, the third opaque separating section G" is formed in rectangular fashion and runs perpendicular to the direction of extent of the third opaque segment O3. The width in the direction of the direction of extent of the third opaque segment O3 is chosen in such a way that the boundary lines with respect to the adjacent transparent segments T1" and T2" are in alignment with the opposite corner points of the opaque separating region G at the third opaque segment O3.

In the manner illustrated in FIGS. 4a and 4b, it is possible to arrange a rectilinear structure at a minimum distance (here 150 nm) with respect to the convex structure from FIG. 2a.

Figure 5:
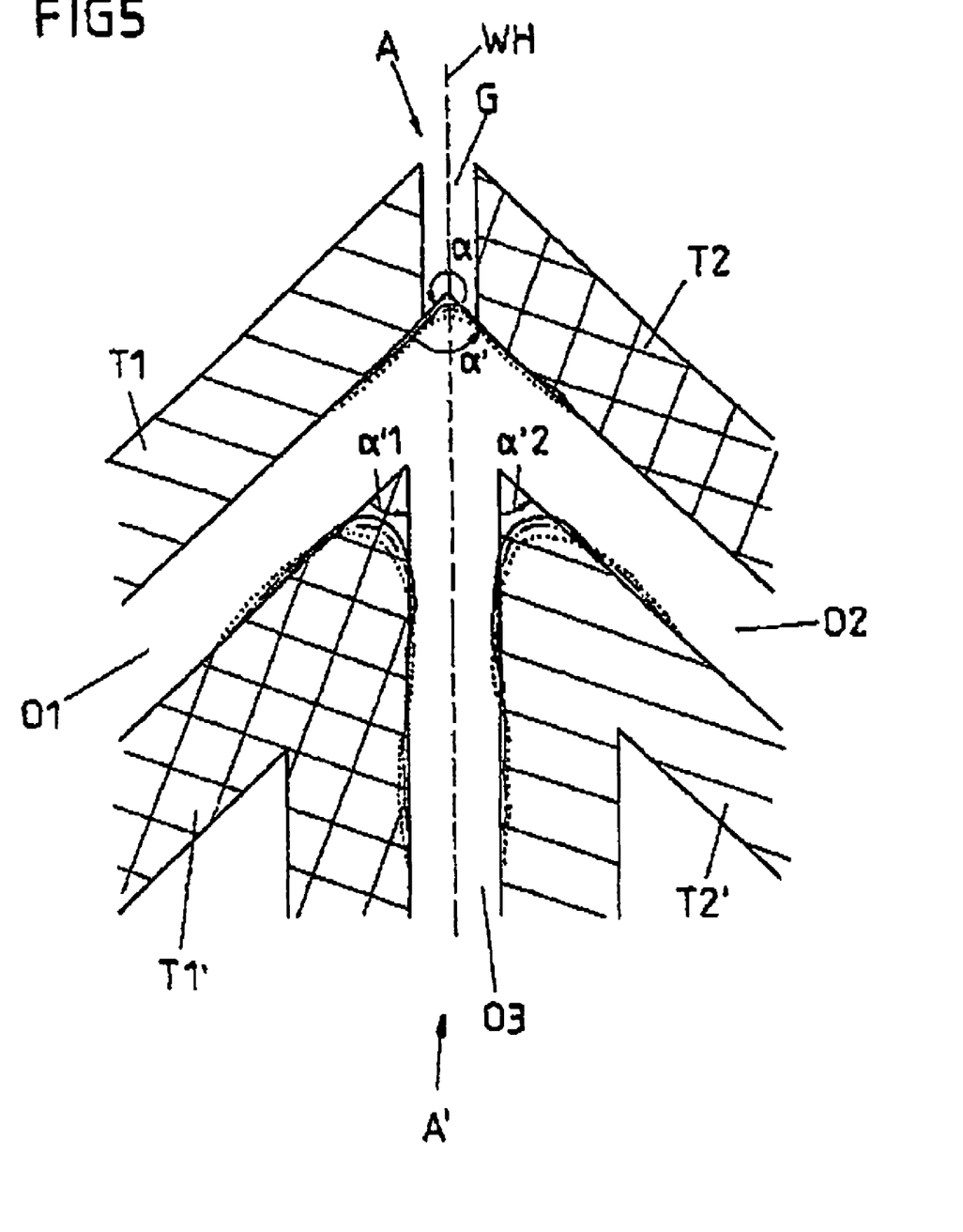
FIG. 5 diagrammatically shows a further embodiment of the first phase mask variant from FIG. 2a with an arrow-shaped opaque structure element.

FIG. 5 illustrates a further exemplary embodiment of the first phase mask variant according to the invention.

In contrast to the convex structure shown in FIG. 2a, here a further, third opaque segment O3 is arranged in the concave section A' along the angle bisector WH of the reflex angle α. As a result, the convex structure acquires the form of an arrow, the counterpart angle α' being divided into two partial angles α'1 and α'2 of identical magnitude by the third opaque segment O3.

In the concave section A', an angled first transparent segment T1', which spans the first partial angle α'1 in this case, extends along the first opaque segment O1 and the third opaque segment O3. In a mirror-inverted fashion with respect to the angle bisector WH, a second angled transparent segment T2' that is in antiphase with respect to the first transparent segment T1' extends between the second opaque segment O2 and the third opaque segment O3.

Figure 6:
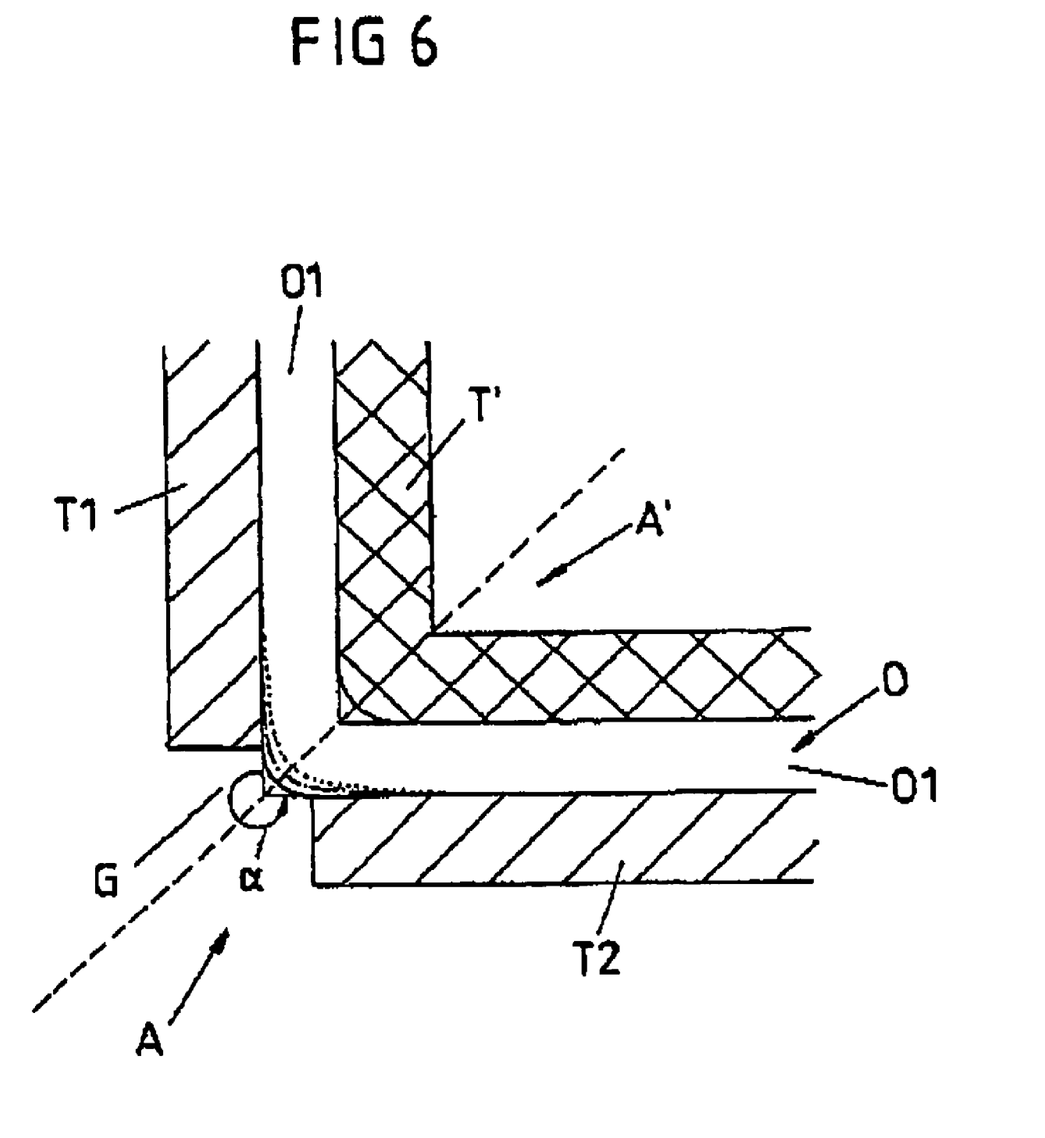
FIG. 6 diagrammatically shows a preferred embodiment of the second phase mask variant according to the invention.

The second variant according to the invention of a phase mask with a convex structure is illustrated in FIG. 6.

The opaque angled structure element O has the same construction and the same dimensions in accordance with FIG. 2a. Arranged in the concave section A' of the structure element O is a transparent segment T' which has a form corresponding to the angled structure element O and extends along the two limbs formed as opaque segments O1 and O2.

In the convex section A, transparent segments T1 and T2 are respectively arranged adjacent to the first opaque segment O1 and adjacent to the second opaque segment O2. The two transparent segments T1 and T2 are formed such that they are in antiphase with respect to the angle-shaped transparent segment T' in the concave section A' and are spaced apart from one another by an opaque separating section G arranged axially symmetrically with respect to the angle bisector WH.

In the case of this second variant of the phase mask according to the invention, the occurrence of constructive interferences of the exposure radiation in the convex bend region is reduced by reducing the coherence of the in-phase exposure radiation that reaches the convex bend region from the transparent segments T1 and T2. This is achieved by virtue of the fact that those sections of the transparent segments T1 and T2 which are adjacent to the convex bend region are sufficiently spaced apart from the bend region and from one another.

In the case of the embodiment illustrated in FIG. 6, in contrast to the embodiment illustrated in FIG. 2a, the opaque separating section G is not in the form of a gap with a fixed distance between the spaced-apart transparent segments, but rather is essentially wedge-shaped with a distance between the spaced-apart transparent segments T1 and T2 that increases away from the convex bend region.

The results of the simulation calculations clearly show that no unacceptable deformation of the convex bend region occurs even when the defocus value of the exposure radiation increases.

This second variant of the phase mask according to the invention likewise again requires a postexposure using a trimming mask. For this purpose, the trimming mask has a transparent segment in the region of the opaque separating section G.

Figure 7:
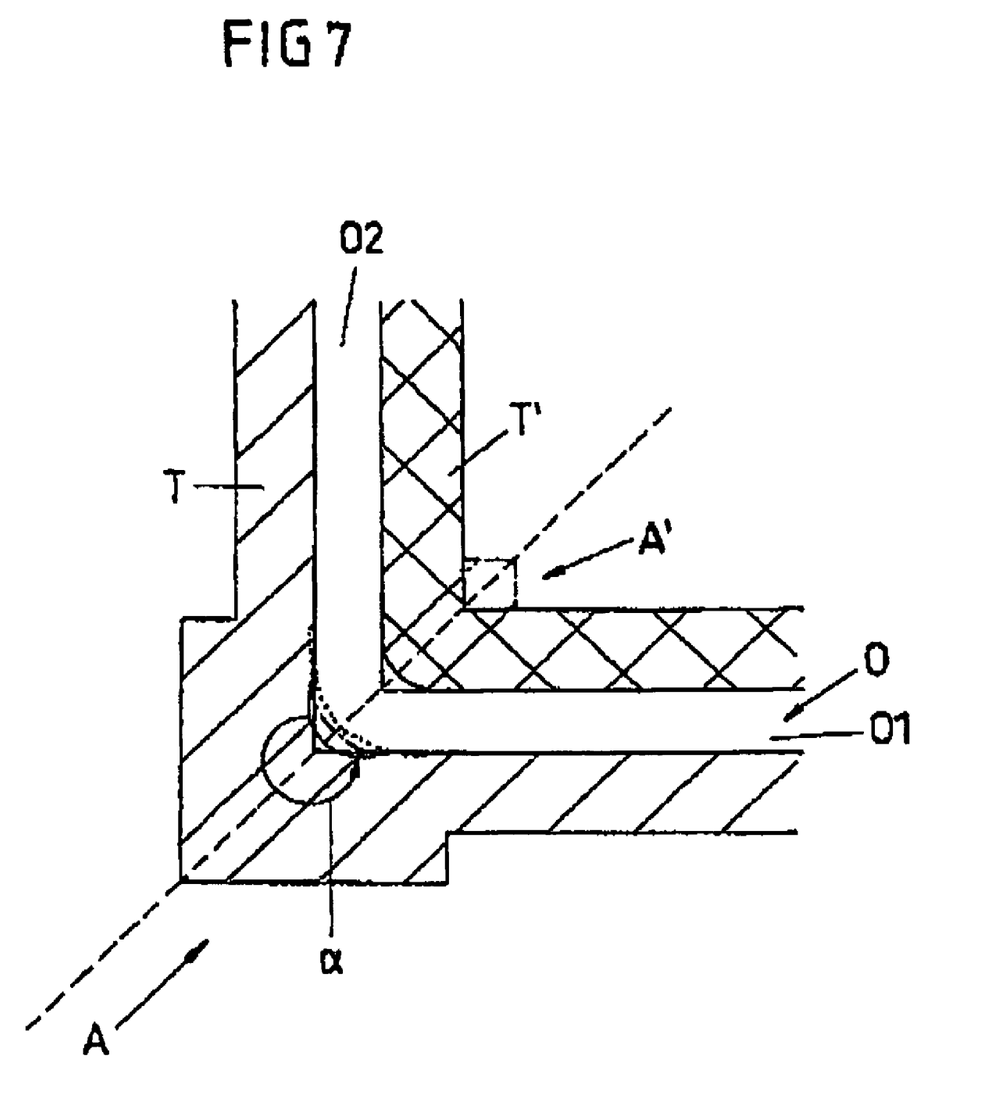
FIG. 7 diagrammatically shows a preferred embodiment of the third phase mask variant according to the invention.

The third variant according to the invention of a phase mask with a convex structure is illustrated in FIG. 7. It is largely similar to the construction illustrated in FIG. 1a with regard to the prior art. Therefore, identical elements are provided with identical reference symbols and reference is made to the corresponding passages of the description.

In contrast to the construction illustrated in FIG. 1, the third variant of the phase mask according to the invention has a section of the transparent segment T that is widened adjacent to the convex bend region along the angle bisector WH.

The transparent segment T widens symmetrically with respect to the angle bisector WH at both opaque segments O1 and O2 in each case in a direction perpendicular to the direction of extent of the opaque segments O1 and O2 by the factor 1.5 before the edges of the transparent segment T converge along the direction of extent of the two opaque segments O1 and O2 at the angle bisector WH. By virtue of this extension, the distance between the convex bend region along the angle bisector WH and the boundary region between the transparent segment T and the surrounding opaque region of the phase mask amounts to approximately 1.5 times the wavelength λ of the exposure radiation.

In the case of this third variant of the phase mask according to the invention, the occurrence of constructive interferences of the exposure radiation in the convex bend region is reduced by reduction of so-called proximity effects. This is to be understood as reduction of reflections from adjacent structures (not illustrated) through the widened transparent segment T. Scattered light through reflection becomes weaker the greater the distance from the structures at which the scattered light is reflected. If the scattered light is reduced at the convex structure, the imaging error is also reduced.

For reasons of symmetry, it is advantageous both to arrange the extended section of the transparent segment axially symmetrically with respect to the angle bisector WH and to widen the opposite in-antiphase transparent segment T' adjacent to the concave bend region.

FIG. 7 illustrates in dashed fashion an extended section which imparts to the transparent segment T' along the angle bisector WH an extent that corresponds to the extended convex section A.

In all the embodiments of the three phase mask variants, the convex structures formed as angled structure elements O have a width of 150 nm at an exposure wavelength λ=193 nm. The widths of the transparent segments are in each case reproduced true to scale. It goes without saying that the phase masks described above and the claimed phase masks can also be employed at shorter exposure wavelengths. For this purpose, dimensions of the described transparent segments and opaque separating sections have to be correspondingly scaled down to the new, shorter exposure wavelength.

All three variants require OPC (Optical Proximity Correction) in order to improve the quality of images generated by the exposure, in particular in order to be able to fabricate opaque segments with edges which are as uniform as possible.

What is claimed is:

1. A lithography mask having an angled structure element formed by a first opaque segment and by a second opaque segment, said structure element having at least one reflex angle, the angled structure element comprising a convex section facing at least one of the reflex angles, at least one transparent structure adjacent to the angled structure element being provided at the convex section of the angled structure element, wherein the transparent structure is formed in two parts at the convex section of the angled structure element by virtue of the fact that it comprises two distinguishable transparent segments formed at least in sections essentially axially symmetrically with respect to the angle bisector of the reflex angle.

2. The lithography mask according to claim 1, wherein at the convex section of the angled structure element, a first transparent segment adjacent to the first opaque segment and a second transparent segment adjacent to the second opaque segment are formed at least in sections essentially axially symmetrically with respect to the angle bisector of the reflex angle.

3. The lithography mask according to claim 1, wherein the first opaque segment and the second opaque segment are formed such that they are essentially rectangular.

4. The lithography mask according to claim 1, wherein the reflex angle has a magnitude of 270°.

5. The lithography mask according to claim 2, wherein the first transparent partial segment is spaced apart from the second transparent partial segment by a separating section.

6. The lithography mask according to claim 5, wherein the separating section is either formed in opaque fashion or an intermediate phase is assigned to it.

7. The lithography mask according to claim 5, wherein the separating section is arranged essentially axially symmetrically with respect to the angle bisector of the reflex angle.

8. The lithography mask according to claim 5, wherein the mask is usable for exposure of a photosensitive material by means of electromagnetic radiation having an exposure wavelength $\lambda$, wherein the separating section between the first transparent segment and the second transparent segment has a width in the range of 0.5 to 1.0 times the exposure wavelength $\lambda$.

9. The lithography mask according to claim 5, wherein the mask is usable for exposure of a photosensitive material by means of electromagnetic radiation having an exposure wavelength $\lambda$, wherein the separating section between the first transparent segment and the second transparent segment has a width in the region of half the exposure wavelength $\lambda$.

10. The lithography mask according to claim 5, wherein the separating region has boundary lines with respect to the transparent segments which run perpendicular to the respectively adjacent opaque segments.

11. The lithography mask according to claim 2, wherein the lithography mask is formed as a phase mask and the first transparent segment is formed such that it is in antiphase with respect to the second transparent segment.

12. The lithography mask according to claim 11, wherein on account of the two-part formation of the transparent structure (T) and the differing phase of the transparent segments (T1; T2) forming the transparent structure (T), phase conflicts that occur are resolved through a two-part formation of transparent structures (T1' with T2'; T1" with T2"), the transparent structures (T1' with T2'; T1" with T2") being formed at opaque structures (O; O3) that are adjacent to the transparent structure (T) formed in two parts.

13. The lithography mask according to claim 12, wherein the transparent structures (T1 with T2; T1' with T2'; T1" with T2") formed in two parts are assigned phases such that transparent segments (T1; T2; T1'; T2'; T1"; T2") that form the transparent structures (T1 with T2; T1' with T2'; T1" with T2") cause a destructive interference effect both at the transition region (G; G'; G") of the two-part formation and at the adjacent opaque segments (O1; O2; O1'; O2'; O3).

14. The lithography mask according to claim 11, wherein the angled structure element has a concave section that faces away from the reflex angle and has a counterpart angle opposite to the reflex angle, characterized in that at the concave section of the angled structure element, a third transparent segment adjacent to the first opaque segment and a fourth transparent segment adjacent to the second opaque segment, said fourth transparent segment being in antiphase with respect to said third transparent segment, are arranged at least in sections essentially axially symmetrically with respect to the common angle bisector of the reflex angle and of the counterpart angle, the transparent segments located opposite at the opaque segments from the convex section to the concave section being formed such that they are in antiphase with respect to one another.

15. The lithography mask according to claim 14, wherein the third transparent segment is spaced apart from the fourth transparent segment in the concave section by a second separating section.

16. The lithography mask according to claim 15, wherein the second separating section is either formed in opaque fashion or an intermediate phase is assigned to it.

17. The lithography mask according to claim 15, wherein the second separating section, in the concave section, is arranged essentially axially symmetrically with respect to the angle bisector of the counterpart angle.

18. The lithography mask according to claim 15, wherein the phase mask has a further angled structure element formed from a third opaque segment and a fourth opaque segment, said structure element having a further reflex angle and a further convex section facing the further reflex angle, the further angled structure element being arranged in such a way that the third transparent segment and the fourth transparent segment of the concave section of the angled structure element, in the convex section of the further angled structure element, acts as a first transparent segment adjacent to the third opaque segment of the further angled structure element and as a second transparent segment adjacent to the fourth opaque segment of the further angled structure element.

19. The lithography mask according to claim 17, wherein a third opaque segment extends adjacent to the second transparent segment of the convex section of the angled structure element and intersects the angle bisector of the reflex angle, a section of the first transparent segment extending parallel to the angle bisector of the reflex angle as far as the third opaque segment and in the direction facing away from the angled structure element adjacent to the third opaque segment, a third separating section being arranged on that side of the third opaque segment which faces away from the angled structure element between a fifth transparent segment running adjacent to the third opaque segment and a sixth transparent segment running adjacent to the third opaque segment, said sixth transparent segment being in antiphase with respect to said fifth transparent segment.

20. The lithography mask according to claim 19, wherein the third separating section is either formed in opaque fashion or an intermediate phase is assigned to it.

21. The lithography mask according to claim 19, wherein the third separating section is arranged axially symmetrically with respect to the angle bisector of the reflex angle.

22. The lithography mask according to claim 21, wherein the width of the third opaque separating section corresponds to the width of the first opaque separating section.

23. The lithography mask according to claim 19, wherein the third separating section runs perpendicular to the direction of extent of the third opaque segment.

24. The lithography mask according to claim 23, wherein the third separating section is arranged opposite the separating section of the convex section of the angled structure element.

25. The lithography mask according to claim 24, wherein the width of the third separating section corresponds to the length of the boundary region between the opaque separating section and the third opaque segment.

26. The lithography mask according to claim 25, wherein the edge regions of the third separating section are in alignment with the ends of the boundary region between the opaque separating section and the third segment.

27. The lithography mask according to claim 11, wherein a third opaque segment is arranged on that side of the angled structure element which faces away from the convex section of the angled structure element in such a way that a first partial angle is formed between the third opaque segment and the first opaque segment and a second partial angle is formed between the third opaque segment and the second opaque segment.

28. The lithography mask according to claim 27, wherein a first angled transparent segment spanning the first partial angle is arranged adjacent to the first and third opaque segments and a second angled transparent segment spanning the second partial angle is arranged adjacent to the second and third opaque segments, the two angled transparent segments in each case being formed in antiphase with respect to the transparent segments located opposite them in the convex section of the angled structure element.

29. The lithography mask according to claim 27, wherein the third opaque segment extends along the angle bisector of the reflex angle lengthened in the direction of the third opaque element and the first partial angle has the same angle magnitude as the second partial angle.

30. The lithography mask according to claim 2, wherein a third opaque segment extends adjacent to the second transparent segment of the convex section of the angled structure element and intersects the angle bisector of the reflex angle, a section of the first transparent segment extending parallel to the angle bisector of the reflex angle as far as the third opaque segment and in the direction facing away from the angled structure element adjacent to the third opaque segment.

* * * * *